United States Patent
Kant et al.

(10) Patent No.: US 8,735,286 B2
(45) Date of Patent: May 27, 2014

(54) DEPOSITION-FREE SEALING FOR MICRO- AND NANO-FABRICATION

(75) Inventors: Rishi Kant, Belmont, CA (US); Roger Thomas Howe, Los Gatos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 179 days.

(21) Appl. No.: 13/284,431

(22) Filed: Oct. 28, 2011

(65) Prior Publication Data

US 2012/0104589 A1    May 3, 2012

Related U.S. Application Data

(60) Provisional application No. 61/408,007, filed on Oct. 29, 2010.

(51) Int. Cl.
*H01L 21/44* (2006.01)

(52) U.S. Cl.
USPC .................................. 438/667; 257/E21.577

(58) Field of Classification Search
USPC .................. 438/411, 422, 668; 257/E21.501, 257/E21.588
See application file for complete search history.

(56) References Cited

U.S. PATENT DOCUMENTS

| | | | |
|---|---|---|---|
| 6,570,217 B1 | 5/2003 | Sato et al. | |
| 7,018,467 B2 | 3/2006 | Geusic et al. | |
| 7,157,350 B2 | 1/2007 | Yang et al. | |
| 7,160,750 B2 | 1/2007 | Benzel et al. | |
| 7,235,456 B2* | 6/2007 | Sato et al. | 438/411 |
| 7,260,125 B2 | 8/2007 | Geusic et al. | |
| 7,294,536 B2* | 11/2007 | Villa et al. | 438/422 |
| 2011/0198746 A1* | 8/2011 | Verhelijden et al. | 257/729 |

OTHER PUBLICATIONS

Provine et al., "Time Evolution of Released Hole Arrays into Membranes via Vacuum Silicon Migration", "Solid-State Sensors, Actuators, and Microsystems Workshop Jun. 6-10, 2010 Hilton Head Island, South Carolina", , pp. 344-347, Published in: US.

Graham, Andrew Blake, "Methods for the Wafer-Scale Encapsulation of MEMS", "Doctoral Dissertation—Stanford University", Aug. 2010, Publisher: Andrew Blake Graham, Published in: US.

Kant et al., "Numerical Modeling and Experimental Verifications of Single-Step, Deposition-Free, Hermetic Sealing Using Silicon Migrat", "Solid-State Sensors, Actuators, and Microsystems Workshop Jun. 6-10, 2010 Hilton Head Island, South Carolina", Apr. 5, 2010, Published in: US.

Kant et al., "Single-Step, Wafer-Scale, Hermetic Sealing Using Silicon Migration", "54th International Conference on Electron, Ion and Photon Beam Technology and Nanofabrication Jun. 1-4, 2010 Anchorage, Alaska", , Published in: US.

\* cited by examiner

*Primary Examiner* — Chandra Chaudhari
(74) *Attorney, Agent, or Firm* — Kaplan Breyer Schwarz & Ottesen, LLP

(57) ABSTRACT

A method for sealing through-holes in a material via material diffusion, without the deposition of a sealant material, is disclosed. The method is well suited to the fabrication and packaging of microsystems technology-based devices and systems. In some embodiments, the method comprises forming sacrificial material release through-holes through a structural layer, removing the sacrificial material via an etch that etches the sacrificial material through the release through-holes, and sealing of the release through-holes via material diffusion.

22 Claims, 9 Drawing Sheets

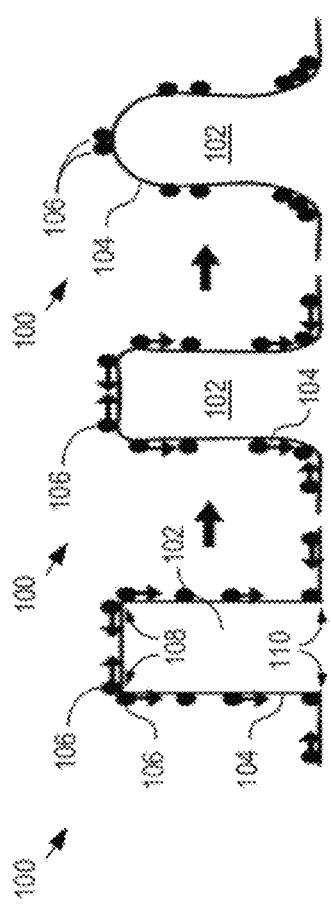
FIG. 1 (Prior Art)
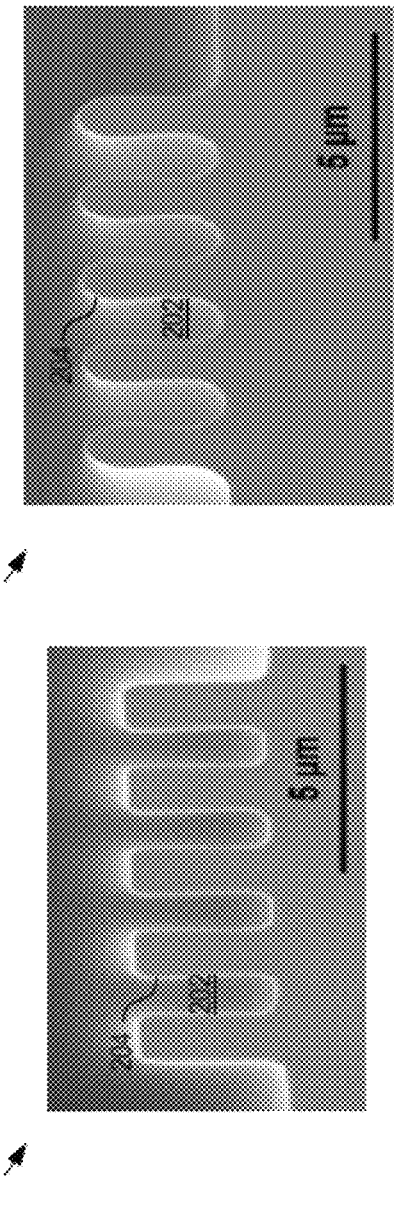
FIG. 2A (Prior Art)
FIG. 2B (Prior Art)

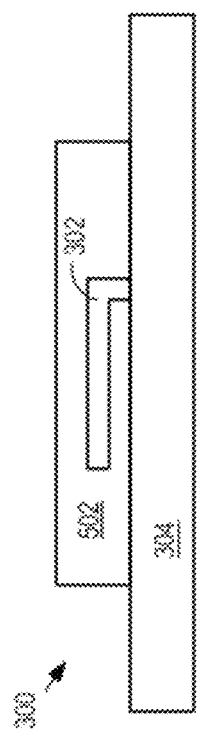
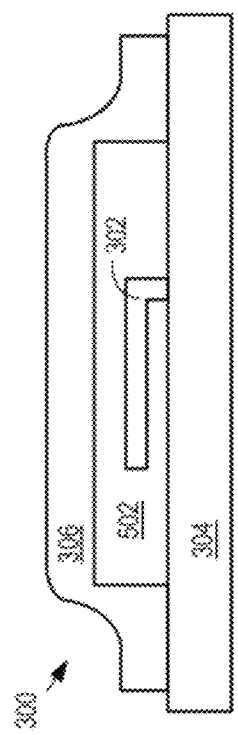
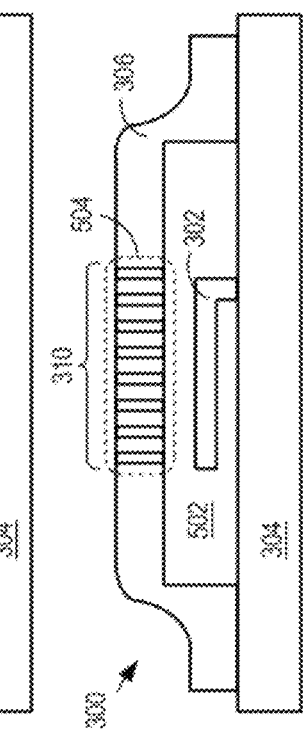
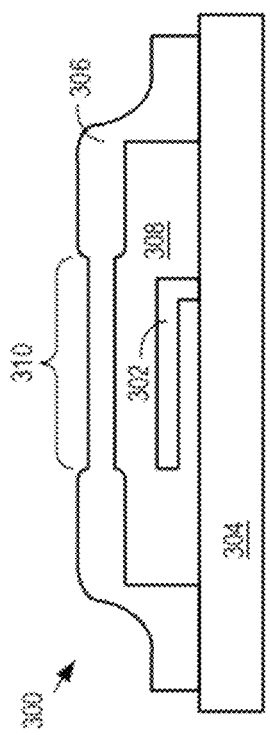
FIG. 5A
FIG. 5B
FIG. 5C
FIG. 5D

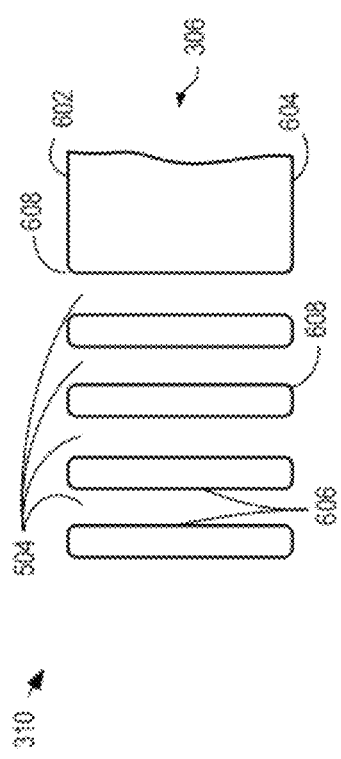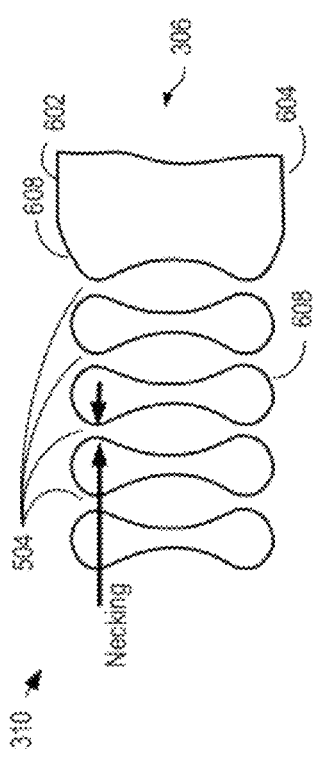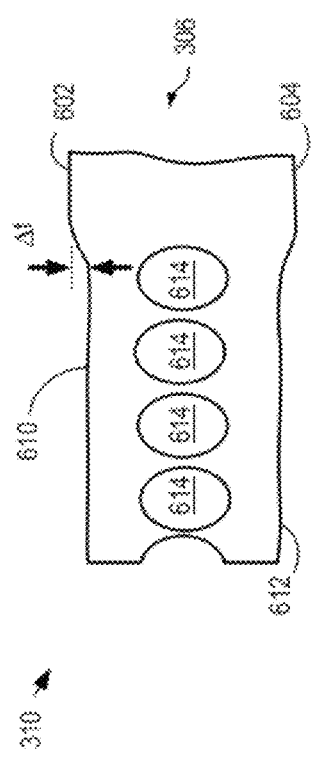

DEPOSITION-FREE SEALING FOR MICRO- AND NANO-FABRICATION

CROSS REFERENCE TO RELATED APPLICATIONS

This application claims priority of provisional patent application U.S. Ser. No. 61/408,007, filed Oct. 29, 2010, the entire contents of which are herein incorporated by reference.

STATEMENT REGARDING FEDERALLY-SPONSORED RESEARCH

This invention was made with Government support under contract HR0011-06-1-0049 awarded by the Defense Advanced Research Projects Agency. The Government has certain rights in the invention.

FIELD OF THE INVENTION

The present invention relates to semiconductor fabrication in general, and, more particularly, to semiconductor, micro-scale, and nano-scale packaging.

BACKGROUND OF THE INVENTION

Advances in Micro Electro Mechanical Systems (MEMS) technology have led to the development of devices and systems that have become ubiquitous in many markets, such as automotive, medical, consumer products, military hardware, and telecommunications. More recently, nanotechnology has begun to show promise in many of these and other areas as well.

MEMS and nanotechnology (broadly referred to as "microsystems technology") derive from integrated-circuit (IC) fabrication processes that are directed toward the formation of mechanical structures on or in the surface of a substrate (typically a silicon or glass wafer). These structures form the bases of a variety of sensors and actuators. Devices such as pressure sensors, accelerometers, gyroscopes, displays, microphones, and optical switches have found commercial success due to the unique capabilities or properties afforded them by the exploitation of microsystems technology. In some cases, however, issues that arise from these fabrication processes themselves have hampered commercial exploitation of microsystems technology.

First, most microsystem fabrication is based on planar-fabrication processes such as layer deposition, photolithography, deep reactive-ion etching, and the like. Although such processes are useful for shaping objects in two-dimensions, they are not well suited to controllably sculpting a structure having a non-linear shape through its thickness.

Second, a microsystem is defined by its inclusion of at least one element that is free to move relative to the substrate on which it is formed (i.e., a mechanically active element). Typically, such an element is formed through a series of layer depositions and etches that leave it encased in a sacrificial material. To make the element mechanically active, the microsystem is subjected to an etch that selectively removes the sacrificial material thereby "releasing" the element from the substrate. Once released, however, mechanically active elements are susceptible to damage from incursion of foreign particles or fluids. As a result, released microsystems require special handling and care as compared to more conventional purely electronic integrated circuits.

A fully processed microsystem wafer ordinarily contains many chips (i.e., die), which are normally arranged in a regular pattern of rows and columns. Typically, before they can be packaged or included in a larger system, the chips must be separated from one another once fabrication is complete.

For conventional electronic integrated circuits, die singulation is a rather straightforward. An integrated-circuit wafer is protected with a layer of polymer or photoresist (normally spun on in liquid state and cured), and then indexed through a saw that cuts through the substrate material in allocated dicing lanes between the rows and columns of chips. During the sawing process, the substrate surface is irrigated with water to wash away debris and help keep the saw blade and substrate cool. After the sawing is complete, the protective layer is easily removed leaving the chips ready for packaging.

For microsystem wafers, however, die singulation is significantly more challenging. Their susceptibility to damage from foreign matter, such as particulates or liquids, means that released microsystem die must either be protected during die singulation or the mechanically active elements must be released after the chips have been separated.

Releasing individual die after singulation, however, is typically not commercially viable. Handling of individual die is cumbersome and negates much, if not all, of the cost advantage associated with batch fabrication and full-wafer processing. In addition, handling individual die is more difficult, which makes chip damage more likely. This not only inherently decreases product yield, but since such damage occurs to chips that are fully completed, the cost-of-scrap for the damaged chips is extremely high.

As a result, protecting microsystems die during singulation, wherein the microsystems have been released at the wafer level, is a more attractive approach. Several commercially successful approaches for separating microsystem chips have been developed in recent years. These are typically based on either providing a bonded cap over each microsystem chip or encapsulating each microsystem with a thin film.

Bonded cap approaches rely on one of several wafer-bonding techniques that can be performed at the wafer level. In such techniques, a cap wafer (typically glass or silicon) is joined to the microsystem wafer in regions surrounding each microsystem chip. These bonding regions must be reserved on the microsystem wafer specifically for this purpose. In some cases, cavities are formed in the cap layer to accommodate structure that projects above the microsystem-substrate surface. The cap wafer and microsystem wafer can be joined with any of several well-known wafer-bonding techniques. These include: high-temperature processes, such as fusion bonding, which is performed at temperatures of approximately 1000° C., or eutectic bonding, which is performed at temperatures in excess of 360° C.; thermo-anodic bonding, which is performed at temperatures typically within the range of approximately 300 to 500° C. while a voltage of several hundred volts is applied across the wafers; and "brazing-like" processes, wherein a bonding constituent, such as a polymer or solder, is provided between the wafers to substantially "glue" them together.

There are several drawbacks to these bonded-cap approaches, however. They add significant complexity to a fabrication process. Further, the addition of a second wafer, as well as the need to allocate space on the microsystem wafer for bonding, increases the overall cost of the resultant devices. In some cases, dissimilar materials, such as glass or metals, are used, which can introduce stress issues into the completed device. Many of these approaches rely upon elevated temperatures or the application of high voltage in order to achieve wafer bonding, which can create reliability issues. In addition, it can be difficult to individually encapsulate one or more small areas within the area of a microsystems chip.

Encapsulation of each microsystem die via a thin film comprises covering the microsystems with a sacrificial material and depositing a thin-film cap layer over the sacrificial layer. After access holes are formed through the cap layer, the sacrificial material is selectively removed and the access holes are sealed to form an enclosed chamber that surrounds the microsystem.

One thin-film encapsulation approach that has been used with great commercial success is referred to as the "epi-seal" process. In an epi-seal process, mechanically active elements formed in the active silicon layer of a silicon-on-insulator substrate are encased in a thin sacrificial layer of silicon dioxide. A first epitaxial layer of silicon is then deposited over the structures. Access holes are formed through this layer of silicon to expose the sacrificial silicon dioxide. After exposing the structures to a vapor-phase hydrofluoric acid treatment (which selectively etches the silicon dioxide), the devices are sealed via a second epitaxial silicon deposition, which closes the access holes thereby leaving the microsystem encapsulated. Epi-seal encapsulation has been shown to be robust enough to withstand the chip-dicing environment. In addition, it enables the final packaged device size to be comparable to the size of the microsystem itself. Further, the epi-seal process results in microsystems that are exclusively single-crystal silicon, which can result in performance advantages.

Epi-seal is not without its disadvantages, however. In many applications, for example, it is desirable to include other materials in addition to single-crystal silicon. Also, epitaxial growth of silicon requires relatively high deposition temperatures that preclude the use of many materials, such as polymers and some metals. Further, epi-seal limits the size of some device layer features, such as trenches, to 2 microns or less. This can restrain the range of motion for mechanically active elements in many designs.

Another thin-film encapsulation approach is based on the disposition of a layer comprising polymer membranes over each microsystem die. The polymer forms a seal that protects the microsystem from damage during dicing. After the chips are singulated, the polymer seals can be removed if desired.

Yet another alternative thin-film encapsulation approach relies upon deposition of a polymer or metallic thin-film layer over released areas of the microsystem chip to seal access through-holes used during the release process.

Although thin-film encapsulation avoids the need for a second wafer and allocated bonding area, it can increase the complexity of the fabrication. In addition, it is less flexible than the bonded-cap approach due to a limited number of appropriate sacrificial and cap layer materials. Further, it can be difficult to achieve suitable coverage over thick, wide structures. Still further, deposition-based encapsulation approaches can leave reactive gases and/or unintended material deposits within the encapsulated cavities. Finally, many such approaches involve additional handling steps and, therefore, inherently decrease production yield.

SUMMARY OF THE INVENTION

The present invention enables microsystem die that are encapsulated in a single step at the wafer-lever after their release without some of the costs and disadvantages of the prior art.

The present invention enables formation of a through-hole-free surface from a layer having one or more through-holes formed completely through its thickness. In some embodiments, the present invention enables creation of one or more individually sealed environments on each chip region of a microsystems wafer. In some embodiments, the present invention enables formation of a substantially smooth surface from a region of layer comprising a plurality of through-holes formed completely through the layer.

Embodiments of the present invention are well suited to sealing of etch-release through-holes of a microsystem device, wafer-scale packaging of microsystems chips, formation of multiple sealed environments having individual internal pressure environments, encapsulation of small regions within the area of a microsystems chip, and formation of optical surfaces such as mirrors.

An embodiment of the present invention comprises a method for closing through-holes formed in a single-crystal silicon layer by means of silicon migration. The method obviates the need for depositing additional material to plug the through-holes, as required in prior-art methods. Surface migration of silicon atoms is induced by exposing the single-crystal silicon layer to an elevated temperature in a low-pressure, inert atmosphere. Under these conditions, surface atoms on exposed silicon surfaces will migrate to achieve the lowest possible total surface energy. Sharp surface features, such as corners, have high surface potential. Silicon migration, however, seeks to attain uniform surface curvature, which has low surface potential. As a result, the surface migration of silicon atoms can be exploited to induce shape transformations, such as the necking down of the regions silicon material between through-holes and expansion of the tops and bottoms of these regions until they meet to form substantially continuous surfaces.

In some embodiments, the inert environment comprises an inert gas at a pressure significantly lower than one atmosphere. Inert gasses in accordance with the present invention include, without limitation, hydrogen, helium, neon, argon, and nitrogen. In some embodiments, surface migration is induced in an atmosphere that is inert-gas-free. In some embodiments, surface migration is induced in an ultra-high vacuum rather than an inert-gas environment (e.g., $10^{-9}$ Torr). In some embodiments, the inert environment is at a pressure that is within the range of approximately $10^{-9}$ Torr to approximately 1 atmosphere.

In some embodiments, surface migration is induced for a material other than single-crystal silicon, such as compound semiconductors, germanium, and the like.

An embodiment of the present invention comprises a method comprising: providing a first layer that comprises a first through-hole that extends completely through the first layer, the first layer comprising a first material; and closing the first through-hole via surface migration of the first material.

BRIEF DESCRIPTION OF THE DRAWINGS

FIG. 1 depicts a schematic drawing of a cross-sectional view of a sidewall formed in a single-crystal silicon layer at different times during shape transformation via hydrogen annealing.

FIGS. 2A and 2B depict scanning-electron-microscope pictures of a cross-sectional view of a trench array formed in single-crystal silicon prior to and after hydrogen annealing.

FIGS. 5A-D depict schematic drawings of a cross-sectional view of microsystem 300 at different points in its fabrication.

FIGS. 6A-6C depicts schematic drawings of a portion of surface-migration region 310 before, during, and after, respectively, closure of through-holes 504 via surface migration.

DETAILED DESCRIPTION

Figure 3:
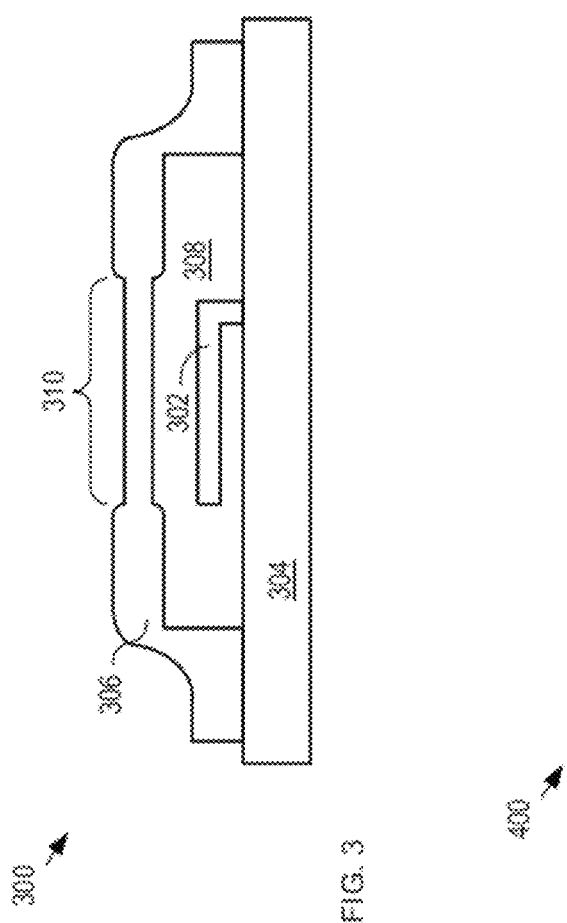
FIG. 3 depicts a schematic drawing of a cross-sectional view of a microsystem in accordance with an illustrative embodiment of the present invention.

Single-step, wafer-scale vacuum packaging can greatly simplify packaging processes for MEMS/NEMS, improve device reliability, and reduce production costs. The present invention exploits the phenomenon of surface migration, wherein surface atoms migrate along an exposed surface in an attempt to minimize surface energy. Sharp features, such as corners, are characterized by relatively high surface energy. Surface migration, therefore, can be employed to reduce the sharpness of such features and even attain substantially uniform surface curvature. As a result, it can lead to significant three-dimensional shape transformations, such as the splitting or joining of surfaces, rounding of feature corners, or reshaping of columnar pillars into rounded projections.

Silicon migration offers an alternative for sealing release through-holes that mitigates or eliminates some of the problems associated with prior-art encapsulation techniques described above. For the purposes of this Specification, including the appended claims, the term "through-hole" is defined as a hole that extends completely through the thickness of a layer. In other words, a through-hole goes a surface on one side of the layer and goes out a surface on the opposing side of the layer. A through-hole can be through a first region of a layer that is thinner than a second region of the layer, however, the through-hole passes completely through the first region.

FIG. 1 depicts a schematic drawing of a cross-sectional view of a sidewall formed in a single-crystal silicon layer at different times during shape transformation via hydrogen annealing. Structure 100 comprises silicon pillar 102, which is characterized by profile 104. Prior to loading in a suitable reactor, pillar 102 is etched to remove all native oxide, thereby exposing silicon surface atoms 106.

At time t=0, structure 100 is subjected to a pure hydrogen environment at a pressure of approximately 10 Torr and at temperature of approximately 1100° C. As a result, surface migration begins, wherein surface atoms 106 begin to move away from convex corners 108 and accumulate at concave corners 110.

The term "silicon surface migration" is often used synonymously with the term "hydrogen annealing" because the process is typically performed in an environment of hydrogen. It should be noted, however, that silicon surface migration can also be performed in other gaseous environments, including, without limitation, helium, neon, argon, nitrogen, and ultra-high vacuum.

Further, silicon surface migration has been demonstrated at pressures ranging from 1 milliTorr to approximately atmospheric pressure; however, lower pressures have been experimentally shown to be preferable. Still further, although temperatures suitable for silicon surface migration are typically within the range of approximately 900° C. to approximately 1100° C., silicon surface migration has been demonstrated at temperatures below this range as well.

At time t=1, profile 104 has changed to soften convex corners 108 and concave corners 110 in response to surface migration that has resulted in significant rounding of convex corners 108 and concave corners 110 exhibit curvature.

At time t=2, profile 104 has transformed from its initial rectangular profile to that of a substantially rounded sidewall. As surface migration continues, profile 104 of pillar 102 moves steadily toward a substantially sinusoidal shape.

FIGS. 2A and 2B depict scanning-electron-microscope pictures of a cross-sectional view of a trench array formed in single-crystal silicon prior to and after hydrogen annealing. Line array 200 comprises lines 202 and profile 204.

The top surface of a bulk single-crystal silicon (SCS) layer is etched to form trenches 202. Prior to hydrogen annealing, each of trenches 202 has a depth of approximately 2.5 microns and a width of approximately 1 micron. Trenches 202 are formed with a pitch of approximately 2 microns.

After being subjected to a five minute-long, 1100° C. anneal in pure hydrogen at a pressure of 10 torr, profile 204 is clearly rounded at both the top and bottom corners, in accordance with the representation depicted above in FIG. 1 at time t=1.

FIG. 3 depicts a schematic drawing of a cross-sectional view of a microsystem in accordance with an illustrative embodiment of the present invention. Microsystem 300 comprises device 302, substrate 304, and cap layer 306.

Figure 4:
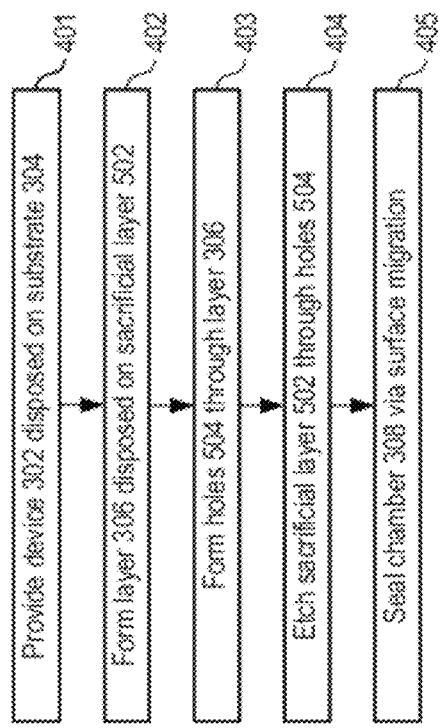
FIG. 4 depicts operations of a method suitable for forming a microsystem in accordance with the illustrative embodiment of the present invention.

FIG. 4 depicts operations of a method suitable for forming a microsystem in accordance with the illustrative embodiment of the present invention. Method 400 begins with operation 401, wherein device 302 is provided. Method 400 is described herein with continuing reference to FIG. 3 and reference to FIGS. 5A-5D and 6A-6C.

FIGS. 5A-D depict schematic drawings of a cross-sectional view of microsystem 300 at different points in its fabrication.

FIG. 5A depicts microsystem 300 prior to deposition of cap layer 306.

Device 302 is a conventional MEMS technology-based device that comprises structural elements made of silicon. In some embodiments, device 302 is nanotechnology-based device. In some embodiments, device 302 is an actuator, such as a switch, resonator, micro-relay, etc. In some embodiments, device 302 is a sensor, such as an accelerometer, pressure sensor, gyroscope, etc. It will be clear to one skilled in the art how to specify, make, and use device 302.

Device 302 is disposed on substrate 304, which is a conventional silicon substrate suitable for supporting the formation of device 302. For the purposes of this Specification, including the appended claims, the term "disposed on" is defined as "exists on" an underlying material or layer. This underlying layer may comprise intermediate layers that interpose the underlying material and the disposed material. For example, if a material is described to be "disposed (or grown) on a substrate," this can mean that either (1) the material is in intimate contact with the substrate; or (2) the material is in contact with one or more intermediate layers that reside on the substrate.

The mechanically active elements of device 302 are encapsulated in sacrificial layer 502. Sacrificial layer 502 comprises a sacrificial material (e.g., borophosphosilicate glass (BPSG)) that can be removed selectively over silicon (i.e., the structural material of device 302 as well as the material of substrate 304).

The materials used for microsystem 300 represent a common material system for MEMS-based microsystems, wherein silicon is used for structural material and BPSG is used for sacrificial material. One skilled in the art will recognize, however, that the material used for device 302, substrate, 304, sacrificial layer 502, and cap layer 306 are a matter of design choice. Considerations for the choice of these materials include, mechanical properties, thermal behavior characteristics, relative etch rates, and stress characteristics. Materials suitable for use in microsystem 300 include, without limitation, single-crystal silicon, polycrystalline silicon, silicon dioxide, BPSG, compound semiconductors, silicon carbide, silicon-rich silicon nitride, ceramics, metals, and composite materials.

At operation 402, cap layer 306 is disposed on substrate 304 and sacrificial layer 502. Cap layer 306 is a layer of structural material suitable for use with device 302 and substrate 304. Typically, although not necessarily, cap layer comprises the same structural material as either device 302 or substrate 304.

FIG. 5B depicts microsystem 300 after the deposition of cap layer 306.

In the illustrative embodiment, sacrificial layer 502 is patterned to expose underlying substrate material on which cap layer 306 deposited such that cap layer 306 and substrate 304 are mechanically joined. In some embodiments, structural elements, such as anchors or walls, interpose substrate 304 and cap layer 306 to enable the cap layer to be mechanically coupled with the substrate.

At operation 403, through-holes 504 are formed in cap layer 306. Through-holes 504 are circular through-holes having a diameter of approximately 0.6 micron. Through-holes 504 extend completely through the thickness of cap layer 306 to expose regions of the top surface of sacrificial layer 502. Through-holes 504 have a diameter that is suitable for enabling access of etch chemicals to sacrificial layer 502 and egress of etch product from the regions of sacrificial layer 502. In addition, through-holes 504 are spaced apart in region 506 by a distance that is suitable for enabling surface migration to completely close the through-holes after sacrificial layer 502 is removed. In some embodiments, the cross-sectional shape of through-holes 504 is other than a circle, such as a square, a rectangular, or an irregular shape.

One skilled in the art will recognize that the diameter and spacing of through-holes 504 are merely exemplary and that these parameters are matters of design choice. Further, in some embodiments only one hole 504 is included. One skilled in the art will further recognize that the potential size range for the diameter and spacing of through-holes 504 is subject to the capabilities of available fabrication technology. Given currently available MEMS and nanotechnology fabrication capability, the diameter of through-holes 504 is within the range of approximately 10 nanometers to approximately 5 microns and the two-dimensional pitch is within the range of approximately 0.1 micron to approximately 10 microns.

At operation 404, sacrificial layer 502 is exposed to a sacrificial etch via through-holes 504. A sacrificial etch attacks the material of sacrificial layer 502 at a significantly faster rate than the structural material of device 302. As a result, the material of sacrificial layer 502 is removed substantially selectively over the structural material of microsystem 300 and substrate 304. For a sacrificial layer comprising BPSG, for example, suitable sacrificial etches include, without limitation, hydrofluoric acid-based vapor, hydrofluoric acid-based wet solutions, and the like. It will be clear to one skilled in the art how to specify, make, and use a sacrificial etch suitable for removing sacrificial layer 502.

After operation 404, substrate 304 and cap layer 306 collectively define chamber 308, which encloses device 302. Since through-holes 504 are still open, however, chamber 308 is not sealed at this point.

FIG. 5C depicts microsystem 300 after formation of through-holes 504.

At operation 405, through-holes 504 are closed via surface migration to seal chamber 308.

The inventors of the present invention recognized that by inducing material diffusion and enabling it to proceed for a sufficient time period, a through-hole through a layer can be completely "pinched off" by migrated material. As a result, the through-hole can be sufficiently closed off that it forms a barrier to the passage of material through the layer—even material that is in the gas phase.

FIGS. 6A-6C depicts schematic drawings of a portion of surface-migration region 310 before, during, and after, respectively, closure of through-holes 504 via surface migration. Surface-migration region 310 comprises through-holes 504, which extend completely through cap layer 306 from top surface 602 to bottom surface 604. FIGS. 6A-6C are described with continuing reference to FIGS. 3 and 4. For the purposes of this Specification, including the appended claims, a "surface-migration region" is defined as a region of a layer that includes at least one through-hole that has been substantially sealed via surface migration such that the sealed through-hole substantially prevents the flow of liquid or gas through layer in the surface migration region.

As depicted in FIG. 6B, during surface migration, silicon atoms from sidewalls 606 of through-holes 504 migrate toward surfaces 602 and 604 of layer cap layer 306 so as to reduce total surface energy of the structure. As a result, a buildup of silicon atoms occurs at convex corners 608 located at the juncture of sidewalls 606 and surfaces 602 and 604. As silicon atoms buildup, a significant rounding of corners 608 occurs. In addition, the loss of silicon atoms from sidewalls 606 thins the walls between through-holes 504. In other words, the regions between through-holes 504 begin to neck.

FIG. 6C depicts a portion of surface-migration region 310 after through-holes 504 have been closed off. The minimum time required for the buildup of silicon atoms at corners 608 to close off at least one of the top and bottom of each of through-holes 504 is defined as time period $t_c$. As depicted in FIG. 6C, the top surface 610 and bottom surface 612 of surface-migration region 310 have merged into substantially continuous layers. Due to the loss of material from sidewalls 606, surface-migration region 310 typically comprises trapped voids 614 at the end of time period $t_c$. In some embodiments, however, the spacing and size of through-holes 504 enables closure of the holes without void formation. Further, as the material of surface-migration region 310 migrates to close through-holes 504, region 310 thins by an amount 2Δt. Δt is the step height between original surfaces 602 and 604 of layer 306 and surfaces 610 and 612 of surface-migration region 310 after surface migration has occurred.

Returning now to FIG. 5, FIG. 5D depicts completely fabricated microsystem 300. In some embodiments, a low-pressure environment characterizes chamber 308 after through-holes 504 are sealed. In some embodiments, chamber 308 comprises a gas, such as hydrogen, nitrogen, neon, etc., after through-holes 504 are sealed.

Figures 7A, 7B:
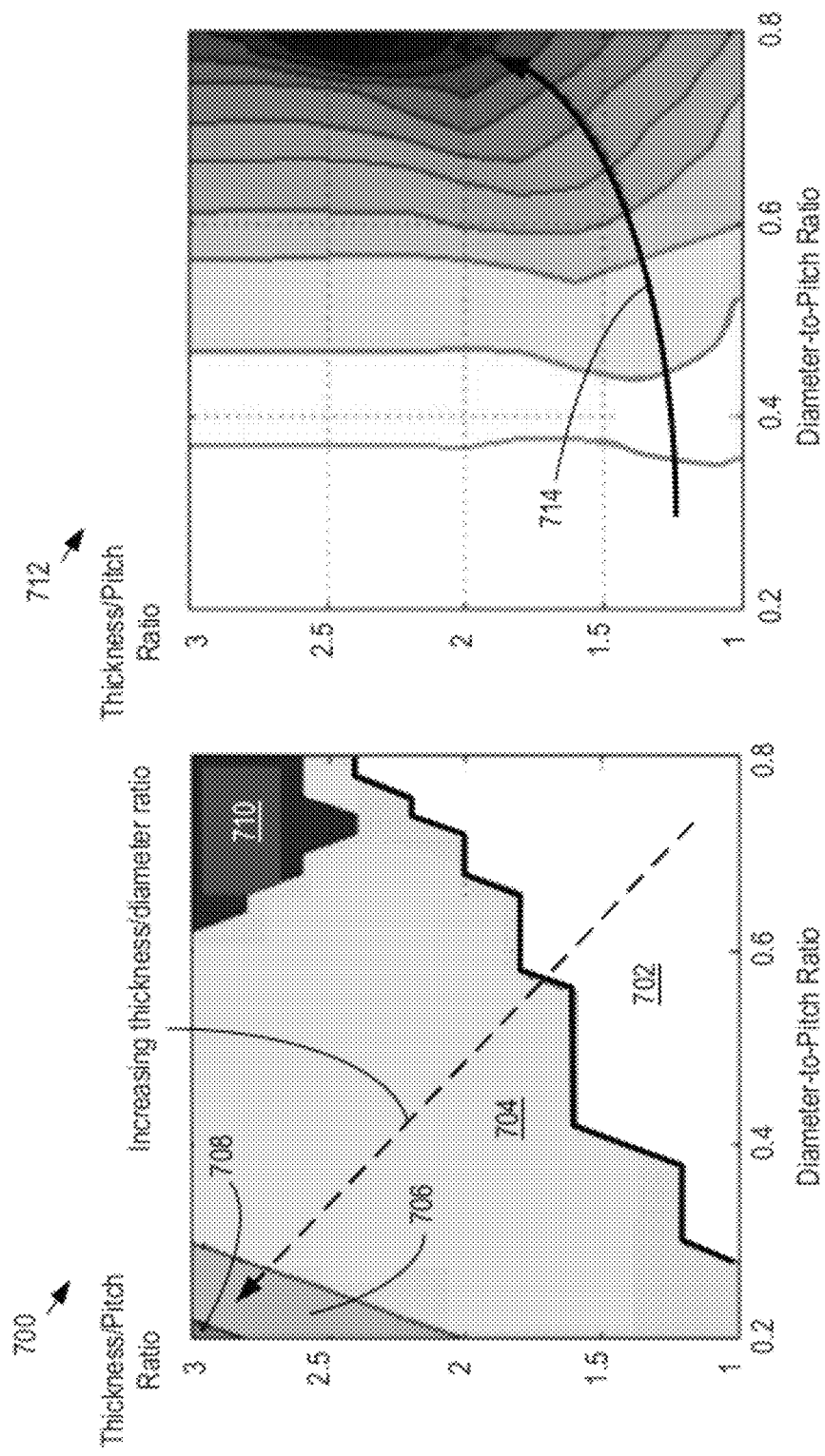
FIG. 7A depicts a plot of data that describes the relationship between the structure of a surface-migration region prior to hydrogen annealing and void formation in the cap layer during hydrogen annealing.
FIG. 7B depicts a plot of data that describes the relationship between the structure of a surface-migration region prior to hydrogen annealing and the step height at the edge of the surface-migration region after hydrogen annealing.

FIG. 7A depicts a plot of data that describes the relationship between the structure of a surface-migration region prior to hydrogen annealing and void formation in the cap layer during hydrogen annealing. The size and number of voids 614 that are formed during hydrogen annealing is strongly affected by a number of inter-related structural characteristics, including the thickness of cap layer 306, the pitch of through-holes 504, and the diameter of through-holes 504. Depending on these factors and their relative dimensions, each through-hole 504 will produce no voids or a vertical arrangement of voids that can range from one to several voids through the thickness of cap layer 306. Further, through-holes 504 and cap layer 306 can be dimensioned such that all voids 614 coalesce into a single large void. In other words, cap layer 306 forms a suspended double membrane.

Plot 700 shows the number of voids formed through the thickness of surface-migration region 310 from each through-hole 504 as a function of the thickness-to-pitch ratio and the diameter-to-pitch ratio. Two important relationships can be determined from examination of plot 700. First, the number of voids 614 formed from each through-hole 504 increases with the ratio of the thickness of cap layer 306 to the diameter of through-holes 504 (i.e., the progression through regions 702, 704, 706, and 708). Second, by forming through-holes 504 having a diameter that is large compared to their pitch in a relatively thick cap layer 306 (i.e., region 710), voids 614 can be induced to coalesce into a single large cavity substantially in the vertical center of surface migration region 310. As a result, cap layer 504 can be transformed into a double layer suspended membrane.

FIG. 7B depicts a plot of data that describes the relationship between the structure of a surface-migration region prior to hydrogen annealing and the step height at the edge of the surface-migration region after hydrogen annealing. Plot 712 shows the relationship between step height, Δt, as a function of the thickness-to-pitch ratio and the diameter-to-pitch ratio. Examination of plot 712 reveals that, for low diameter-to-pitch ratios, there is little dependence of step height on the thickness-to-pitch ratio. As the diameter-to-pitch ratio increases above approximately 5.5, however, the thickness-to-pitch ratio becomes an increasingly stronger influence on step height, as indicated by arrow 714.

The resultant structure of surface-migration region 310, therefore, can be controlled by careful control of the thickness of cap layer 306 and the size and distribution of through-holes 504.

Figure 8:
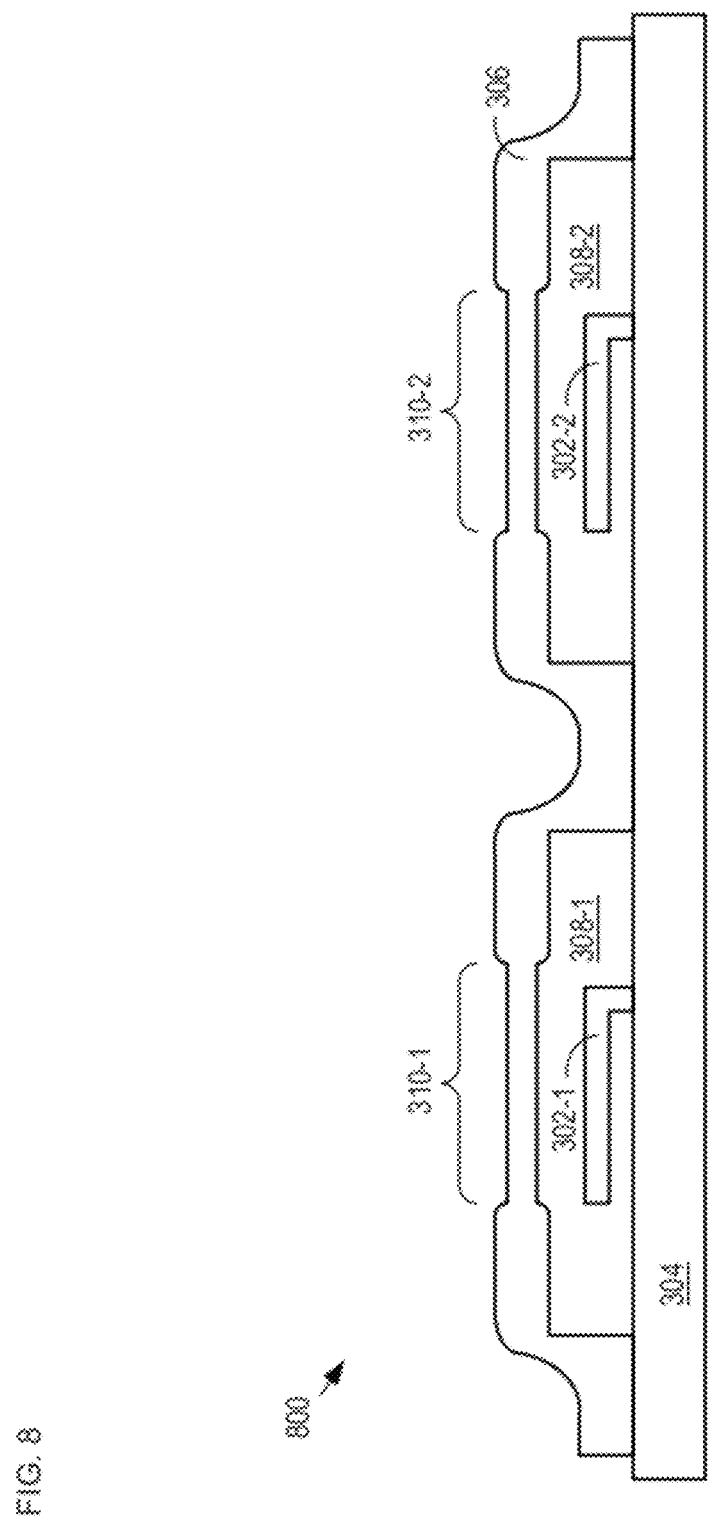
FIG. 8 depicts a schematic drawing of a cross-sectional view of a microsystem chip in accordance with a first alternative embodiment of the present invention.

FIG. 8 depicts a schematic drawing of a cross-sectional view of a microsystem chip in accordance with a first alternative embodiment of the present invention. Microsystem chip 800 comprises microsystem 300-1 and 300-2.

Each of microsystems 300-1 and 300-2 is provided with its own unique environment within chambers 308-1 and 308-2, respectively, by independently performing operations 404 and 405 on each microsystem. For example, surface-migration region 310-2 is protected with silicon nitride during the removal of sacrificial material from chamber 308-1 and subsequent sealing of the holes in surface-migration region 310-1. The silicon nitride inhibits surface migration in surface-migration region 310-2 leaving surface-migration region 310-2 unaltered.

After chamber 308-1 has been sealed, operations 404 and 405 are repeated to remove sacrificial material from chamber 308-2 and seal the holes in surface-migration region 310-2. By altering the conditions that induce surface migration during operation 405, chambers 308-1 and 308-2 are provided with atmospheres having different pressures and/or gas concentration and/or residual gas type.

Different environments in separate chambers can also be provided by forming surface-migration regions with different hole geometries. During operation 405, therefore, some surface-migration regions become sealed before other surface-migration regions. The unsealed surface-migration regions can then be sealed via a second surface migration step using different conditions so that their respective chambers have a different environment after their holes are completely sealed.

Figure 9A:
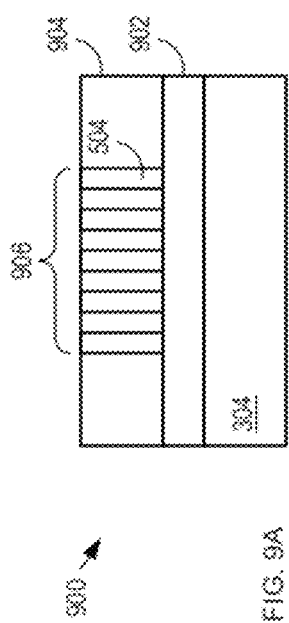
FIGS. 9A-C depict schematic drawings of cross-sectional views of a microsystem chip at different points in its fabrication in accordance with a second alternative embodiment of the present invention.
Figure 9B:
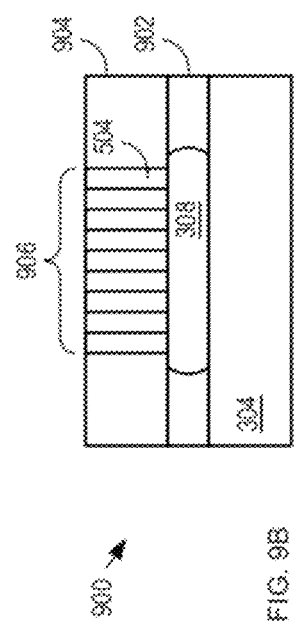
Figure 9C:
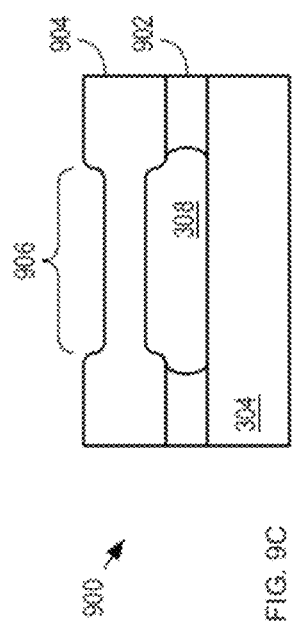

FIGS. 9A-C depict schematic drawings of cross-sectional views of a microsystem chip at different points in its fabrication in accordance with a second alternative embodiment of the present invention. Microsystem 900 is a sensor whose output signal is based on the separation between cap layer 904 and substrate 304, such as a capacitive pressure sensor whose capacitance is based on the separation between cap layer 904 and substrate 304, an optically resonant cavity whose reflectivity is based on the separation between them, and the like. In some further embodiments, the deflection of cap layer 904 is monitored via techniques based on piezo-resistivity, magneto-striction, and the like. In still some other embodiments, microsystem 900 is an actuator, such as an acoustic speaker, a resonator, or a tunable reflector whose reflectivity is based on the separation between cap layer 904 and substrate 304 (e.g., a deformable mirror, controllable optical beam splitter, etc.). Microsystem 900 comprises substrate 302, sacrificial layer 902, and cap layer 904. For clarity, electrodes for sensing or controlling the separation between the cap layer and substrate are not shown.

In addition to forming sealed cavities via surface migration, it has been recognized by the inventors that surface migration can also enable devices and systems wherein through-holes 504 are not completely sealed (i.e., where surface migration is terminated prior to $t_c$). As a result, embodiments of the present invention include layers having small "pores" through which liquid or gas can flow. Methods in accordance with the present invention, therefore, are suitable for forming pores that are much smaller than those attainable via conventional photolithography and etching. Such pores are suitable for use in a variety of nano-filtration applications.

FIG. 9A depicts microsystem 900 after the formation of through-holes 504 in cap layer 904. Cap layer 904 is analogous with cap layer 306 described above and with respect to FIGS. 3-6.

FIG. 9B depicts microsystem 900 after the removal of a portion of sacrificial layer 902. Sacrificial layer 902 is analogous with sacrificial layer 502 described above and with respect to FIGS. 3-6. The portion of sacrificial layer 902 below surface-migration region 906 is removed in a timed sacrificial etch that partially undercuts cap layer 904 outside of surface-migration region 906.

FIG. 9C depicts microsystem 900 after through-holes 504 have been closed via surface migration.

In some applications, particularly optical applications, it is important that the surface of a sealed region, such as surface-migration regions 310 and 906 are smooth and substantially defect-free. As a result, in some embodiments, surface migration is continued beyond time period $t_c$ to facilitate smoothing and planarization of a surface-migration region.

Figure 10B:
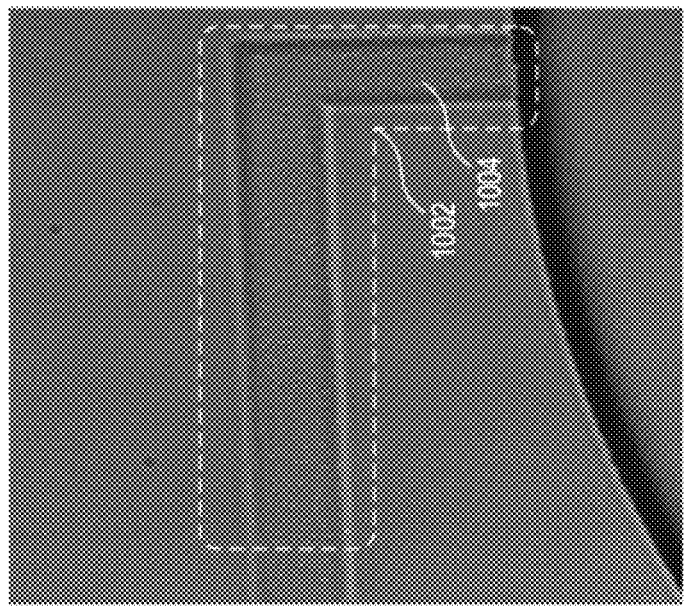
FIGS. 10A and 10B depict a surface-migration region before and after hole closure via surface migration.
Figure 10A:
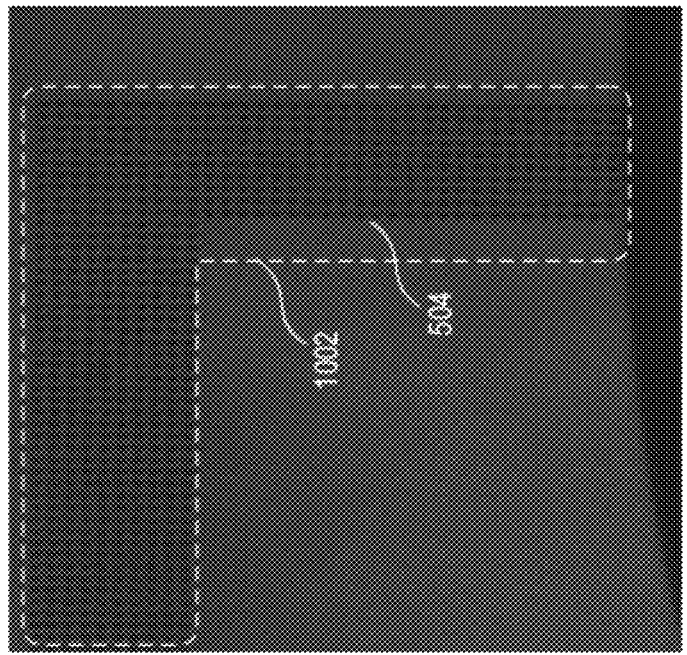

FIGS. 10A and 10B depict a surface-migration region before and after hole closure via surface migration. In comparing FIGS. 10A and 10B, closure of through-holes 504 and substantial planarization of surface 1004 of surface-migration region 1002 is clearly evident. In some cases, surface 1004 displays some surface roughness after surface migration, as seen in FIG. 10B; however, in some applications some surface roughness can be tolerated.

Figures 11, 12:
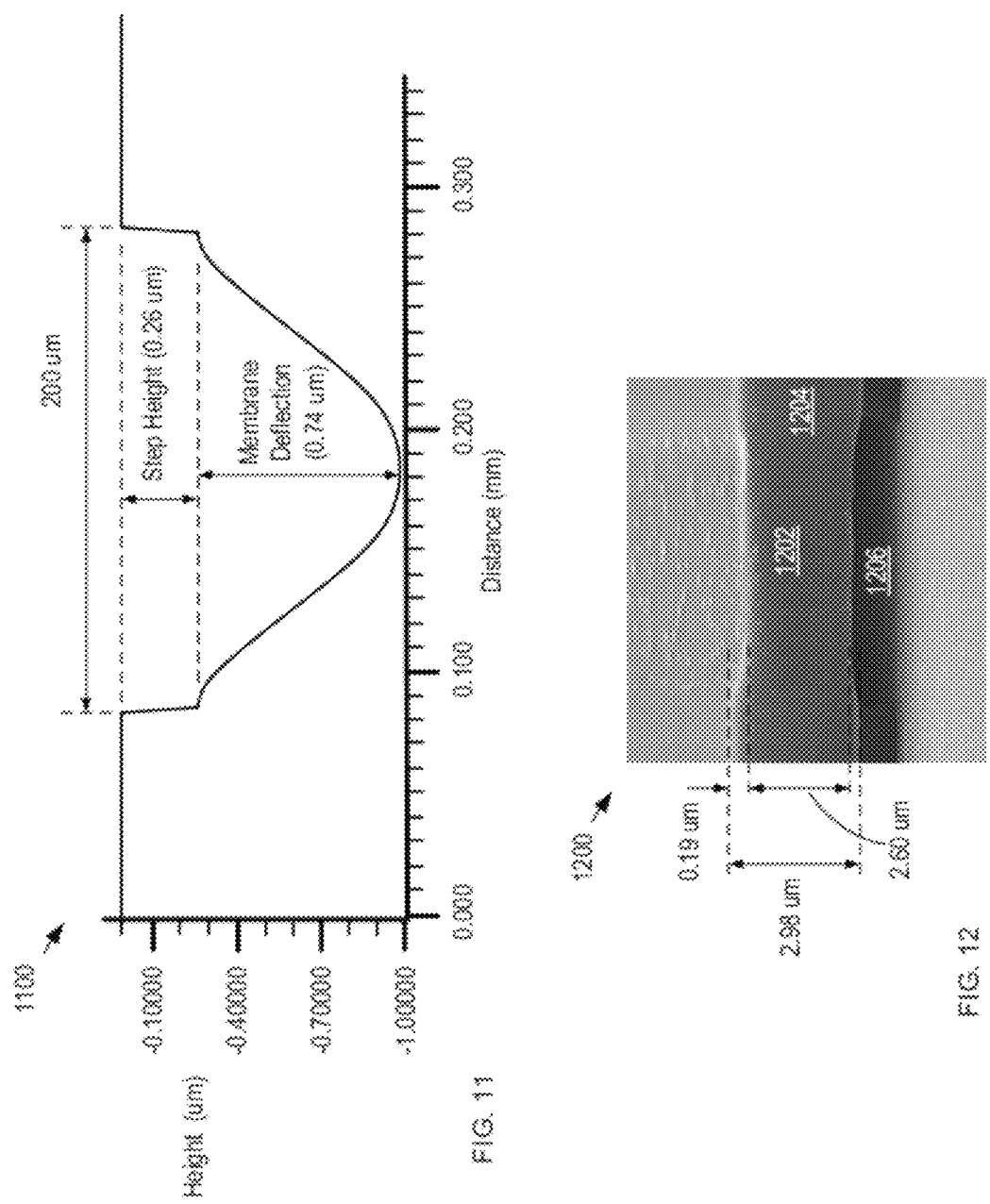
FIG. 11 depicts a plot of the deflection of a surface-migration region after its holes have been sealed via surface migration.
FIG. 12 depicts a scanning-electron-microscope picture of a cross-sectional view of a surface-migration region after hydrogen annealing.

FIG. 11 depicts a plot of the deflection of a surface-migration region after its holes have been sealed via surface migration. Plot 1100 depicts deflection across a cap layer analogous to cap layer 904, having a 200 micron-diameter released region. The surface-migration region for this device was formed via an array of approximately 0.62 micron-diameter through-holes having a pitch of approximately 1 micron. Maximum deflection at the center of the released region is approximately 0.74 micron for the sample shown, which corresponds to an internal pressure of 10 milliTorr for the chamber of this device. Ten substantially identical samples were fabricated and the maximum deflection was found to remain stable for nine of the devices over a period of 210 days, thereby demonstrating little or no leak rate through holes sealed via surface migration.

FIG. 12 depicts a scanning-electron-microscope picture of a cross-sectional view of a surface-migration region after hydrogen annealing. Structure 1200 comprises surface-migration region 1202, which is formed in cap layer 1204 above cavity 1206. Surface-migration region 1202 was formed via an array of approximately 0.62 micron-diameter through-holes having a pitch of approximately 1 micron. Cap layer 1204 has a thickness of approximately 2.98 microns. As a result, surface-migration region 1202 has an initial thickness of 2.98 microns. After hydrogen annealing, however, the thickness of surface-migration region 1202 has been reduced to approximately 2.60 microns. Step height $\Delta t$, therefore, is approximately 0.19 microns.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method comprising:
    providing a first layer that comprises a first through-hole that extends completely through the first layer, the first layer comprising a first material;
    closing the first through-hole via surface migration of the first material;
    providing a second layer that comprises a second through-hole that extends completely through the second layer, the second layer comprising a second material; and
    closing the second through-hole via surface migration of the second material.

2. The method of claim 1 further comprising:
    forming the first layer such that it is disposed on a second layer that is disposed on a substrate, the second layer comprising a second material; and
    exposing the second layer to a first etch through the first through-hole, wherein the first etch etches the second material at a faster rate than it etches the first material.

3. The method of claim 1 further comprising providing the first layer disposed on a substrate such that the first layer and the substrate collectively define at least a portion of a first chamber, wherein the first chamber is substantially sealed when the first through-hole is closed.

4. The method of claim 3 further comprising providing a first environment in the first chamber, wherein the first environment is characterized by at least one of a first pressure and a first gas.

5. The method of claim 3 further comprising providing the first environment such that it is characterized by a pressure that is less than or equal to 10 Torr.

6. The method of claim 3 further comprising providing the first environment such that it is characterized by a pressure that is less than one atmosphere.

7. The method of claim 3 further comprising providing a first microsystem, wherein the first chamber surrounds the first microsystem.

8. The method of claim 1 wherein the first through-hole is provided as one of a first plurality of through-holes that is located in a first region of the first layer, and wherein the first region is substantially continuous and substantially planar when each of the first plurality of through-holes is closed.

9. The method of claim 1 wherein surface migration of the first material is induced by operations comprising:
    placing the first layer in an atmosphere that is substantially inert, wherein the atmosphere is characterized by a pressure that is less than or equal to 760 Torr;
    heating the first layer to a temperature that is equal to or greater than a first set point; and
    maintaining the temperature of the first layer at or above the first set point for at least a first time period that is sufficient to enable first material from the sidewalls of the through-hole to migrate toward a surface of the first layer and join as a continuous region.

10. The method of claim 1 wherein the first material and second material are the same material.

11. The method of claim 1 further comprising:
    providing the first layer disposed on a substrate such that the first layer and the substrate collectively define at least a portion of a first chamber, wherein the first chamber is substantially sealed when the first through-hole is closed;
    providing a first environment in the first chamber, wherein the first environment is characterized by at least one of a first pressure and a first gas;
    providing the second layer disposed on the substrate such that the second layer and the substrate collectively define at least a portion of a second chamber, wherein the second chamber is substantially sealed when the second through-hole is closed; and
    providing a second environment in the second chamber, wherein the second environment is characterized by at least one of a second pressure and a second gas.

12. The method of claim 11 wherein the first environment and the second environment are provided such that the first pressure and second pressure are the same pressure.

13. The method of claim 11 wherein the first environment and the second environment are provided such that the first gas and second gas are the same gas.

14. The method of claim 1 wherein the first through-hole is provided as one of a first plurality of through-holes that is located in a first region of the first layer, and wherein the method further comprises closing each of the first plurality of through-holes via surface migration of the first material.

15. The method of claim 10 wherein the first layer and the second layer are provided such that they are different regions of the same layer.

16. A method comprising:
providing a first layer disposed on a substrate, the first layer comprising a first through-hole that extends completely through the first layer, and the first layer comprising a first material; and
closing the first through-hole via surface migration of the first material;
wherein the first layer is provided such that it is movable relative to the substrate, and wherein the first layer and the substrate collectively define a device whose output signal is based on the position of the first layer relative to the substrate.

17. A method comprising:
providing a first layer of a first material, the first layer being disposed on a first region of a substrate and a second region of the substrate, wherein the first region and second region are non-contiguous;
providing a second layer of a second material, the second layer being disposed on the first layer in each of the first region and second region, and the second layer including first through-hole in the first region and a second through-hole in the second region;
exposing the first material in each of the first region and second region to a first etch that etches the first material faster than the second material;
closing the first through-hole via a first surface migration of the second material, wherein the second layer and the substrate collectively define at least a portion of a first chamber in the first region when the first through-hole is closed; and
closing the second through-hole via a second surface migration of the second material, wherein the second layer and the substrate collectively define at least a portion of a second chamber in the second region when the second through-hole is closed.

18. The method of claim 17 further comprising:
providing a first environment in the first chamber, wherein the first environment is characterized by a first pressure and a first gas; and
providing a second environment in the second chamber, wherein the second environment is characterized by a second pressure and a second gas.

19. The method of claim 18 wherein the first environment and second environment are provided such that the second gas is different than the first gas.

20. The method of claim 18 wherein the first environment and second environment are provided such that the second pressure is different than the first pressure.

21. The method of claim 17 wherein the second layer is provided such that is movable relative to the substrate in the first region after the first through-hole is closed, and wherein the second layer and the substrate collectively define a device in the first region whose output is based on the position of the second layer relative to the substrate.

22. The method of claim 21 wherein the device is selected from the group consisting of a pressure sensor, tunable reflector, speaker, deformable mirror, optically resonant cavity, and capacitor.

* * * * *